United States Patent
Lee et al.

(10) Patent No.: US 7,521,953 B2
(45) Date of Patent: Apr. 21, 2009

(54) TEST APPARATUS FOR TESTING OPERATION OF A PRINTED CIRCUIT BOARD

(75) Inventors: Yung-Tang Lee, Taipei (TW); Hsien-Tsung Ho, Taipei (TW)

(73) Assignee: Inventec Appliances Corp., Taipei (TW)

( * ) Notice: Subject to any disclaimer, the term of this patent is extended or adjusted under 35 U.S.C. 154(b) by 0 days.

(21) Appl. No.: 11/896,623

(22) Filed: Sep. 4, 2007

(65) Prior Publication Data

US 2008/0054910 A1 Mar. 6, 2008

(30) Foreign Application Priority Data

Sep. 5, 2006 (TW) .............................. 95132800 A

(51) Int. Cl.
  *G01R 31/26* (2006.01)
  *G01R 31/02* (2006.01)
(52) U.S. Cl. ....................... 324/765; 324/754
(58) Field of Classification Search .............. 324/158.1, 324/754–765
  See application file for complete search history.

(56) References Cited

U.S. PATENT DOCUMENTS

| | | | | |
|---|---|---|---|---|
| 4,099,120 A | * | 7/1978 | Aksu | 324/761 |
| 4,820,975 A | * | 4/1989 | Diggle | 324/758 |
| 5,109,596 A | * | 5/1992 | Driller et al. | 29/705 |
| 5,150,041 A | * | 9/1992 | Eastin et al. | 324/758 |
| 5,228,189 A | * | 7/1993 | Driller et al. | 29/705 |
| 5,500,606 A | * | 3/1996 | Holmes | 324/761 |
| 5,572,144 A | * | 11/1996 | Davidson et al. | 324/755 |
| 7,400,135 B1 | * | 7/2008 | Bartholomew et al. | 324/158.1 |

* cited by examiner

*Primary Examiner*—Ha Tran T Nguyen
*Assistant Examiner*—Joshua Benitez
(74) *Attorney, Agent, or Firm*—Rosenberg, Klein & Lee

(57) ABSTRACT

A test apparatus includes lower and upper spacer discs for sandwiching and securing a printed circuit board therebetween, lower and upper plates, and a two-step driving mechanism. The lower and upper spacer discs are spaced apart from the lower and upper plates. Activation of the test apparatus in a first step results in relative movement between the spacer discs to sandwich the circuit board therebetween. Activation of the test apparatus in a second step results in relative movement between the lower and upper plates to sandwich the upper and lower spacer discs therebetween.

10 Claims, 7 Drawing Sheets

TEST APPARATUS FOR TESTING OPERATION OF A PRINTED CIRCUIT BOARD

FIELD OF THE INVENTION

The present invention relates to a test apparatus. More particularly, the invention relates to a test apparatus for testing a printed circuit board in a two-step manner so as to improve the testing accuracy.

BACKGROUND OF THE INVENTION

During mass production of electronic products and prior to assembly of a printed circuit board therein, a test operation conducted onto the printed circuit board plays a major role. The electrical contacts of a respective printed circuit board must under go a testing operation in order ensure the circuit operation thereof. Only after assuring that there is no short circuit in the printed circuit board, the assembly of the former is carried out.

FIG. 1 is a perspective view of a conventional test apparatus 1 in use presently in the assembly line. The test apparatus 1 accordingly includes a foundation 11, a base seat 12, an upper plate 13, a lower plate 14 and a coupler arm unit 15. The upper plate 13 is formed with four holding tubes 131, and has a plurality of probes 132. The lower plate 14 is formed with four retention inserts 141, and has a plurality of probes 142 respectively aligned with the probes 132 of the upper plate 13. The foundation 11 is equipped with a plurality of control units and circuit paths for establishing electrical communication the probes of the upper and lower plates 24, 22 via the coupling arm unit 15. A pneumatically operated piston unit serves as the control unit for moving the upper plate 13 with respect to the lower plate 14 so as to conduct the test operation thereof.

For carrying out the test operation, the printed circuit board under test is disposed above the lower plate 14, in which, the electrical contacts on one side of the printed circuit board are engaged with the probes 142 of the lower plate 14. The upper plate 13 is pressed downward via the coupling arm unit 15 toward the lower plate 14, in which, the retention inserts 141 of the lower plate 14 extend respectively into the holding tubes 131 of the upper plate 13. Under this condition, the electrical contacts on the other side of the printed circuit board are engaged with the probes 132 of the upper plate 13. The operator reads the test result with the assistance of corresponding software or programs.

Note that since the print circuit board under test is placed onto the lower plate manually by the operator, the same is subjected to shift from its initial position during the testing operation (i.e. since being pressed by the upper plate 13). The board displacement during the testing operation may result in misalignment between the probes of the upper and lower plate with respect to the electrical contacts of the printed circuit board, thereby causing bending of the printed circuit board, which, in turn, affects some components (such as Ball Grid Array) mounted thereon in addition the inaccurate test result and rupture at the soldering balls.

SUMMARY OF THE INVENTION

Therefore, an object of the present invention to provide a test apparatus, which carries out the test operation in a two-step manner so as to achieve the accurate testing operation thereof.

In accordance with the present invention, a test apparatus is provided for testing operation of a printed circuit board. The test apparatus includes a bottom seat, a lower plate, a lower spacer disc, an upper plate, an upper spacer disc and a two-step driving mechanism.

The lower plate is coupled operably onto the bottom seat, and has an upper surface formed with a plurality of first probes. The lower spacer disc is coupled operably to the lower plate, and has a plurality of first openings respectively aligned with the first probes of the lower plate. The upper plate is disposed above the lower spacer lower disc, is coupled operably onto the bottom seat, and has a lower surface formed with a plurality of second probes. The upper spacer disc is disposed below the upper plate, and has a plurality of second openings respectively aligned with the second probes of the upper plate.

The driving mechanism drives the lower plate, the lower spacer disc, the upper plate and the upper spacer disc relative to one another in the two-step manner such that once the printed circuit board under test is disposed on the lower spacer disc, activation of the driving mechanism in a first step results in relative movement between the lower and upper spacer discs, thereby sandwiching and retaining the printed circuit board between the lower and upper spacer discs. Activation of the driving mechanism in a second step results in relative movement between the lower and upper plates so as to sandwich the lower and upper spacer discs between the lower and upper plates such that the probes of the lower and upper plates extend respectively through the openings in the lower and upper spacer discs to engage two opposite side surfaces of the printed circuit board.

The test apparatus of the present invention further includes a first coupling unit for mechanically coupling the lower spacer disc to the lower plate, a second coupling unit for mechanically coupling the upper plate to the bottom seat and a third coupling unit for coupling mechanically the upper spacer disc to the upper plate, wherein once the printed circuit board under test is disposed on the lower spacer disc, activation of the second coupling unit causes sandwiching of the printed circuit board between the upper and lower spacer discs, and activation of the first and third coupling units in the second step results in simultaneous movement of the upper and lower plates respect to the bottom seat, which, in turn, causes sandwiching of the upper and lower spacer discs between the upper and lower plates such that the probes of the lower and upper plates extend respectively through the openings in the lower and upper spacer discs to engage two opposite side surfaces of the printed circuit board.

The test apparatus of the present invention further includes a control unit for activating the driving mechanism in the first and second steps. It is to note that the test operation is conducted in full automatic manner. The test apparatus can also be manipulated manually or operated in semi-automatic manner. The control unit includes a relay for controlling inner circuit paths and a switch button for switching on and off the relay when the test apparatus is operated in the automatic manner. In the event, the test apparatus is manipulated manually; a coupling shaft is utilized on behalf of the control unit.

Preferably, the lower spacer disc in the aforesaid test apparatus has an upper surface greater than a lower surface of the upper spacer disc. Generally, the electrical contacts of the printed circuit board under test are concentrated at the middle portion thereof so as to reserve the outer peripheral portion for soldering with the other electronic components in case the circumstance demands in the future. The purpose of designing a smaller surface area in the upper spacer disc relative to the lower spacer disc is to avoid undesired pressing on the outer peripheral portion of the printed circuit board during the testing operation, thereby eliminating the defect of bending in the printed circuit board generally encountered when using the prior test apparatus.

BRIEF DESCRIPTION OF THE DRAWINGS

Other features and advantages of the present invention will become more apparent in the following detailed description of the preferred embodiments of this invention, with reference to the accompanying drawings, in which.

DETAILED DESCRIPTIONS OF THE PREFERRED EMBODIMENTS

Figure 1:
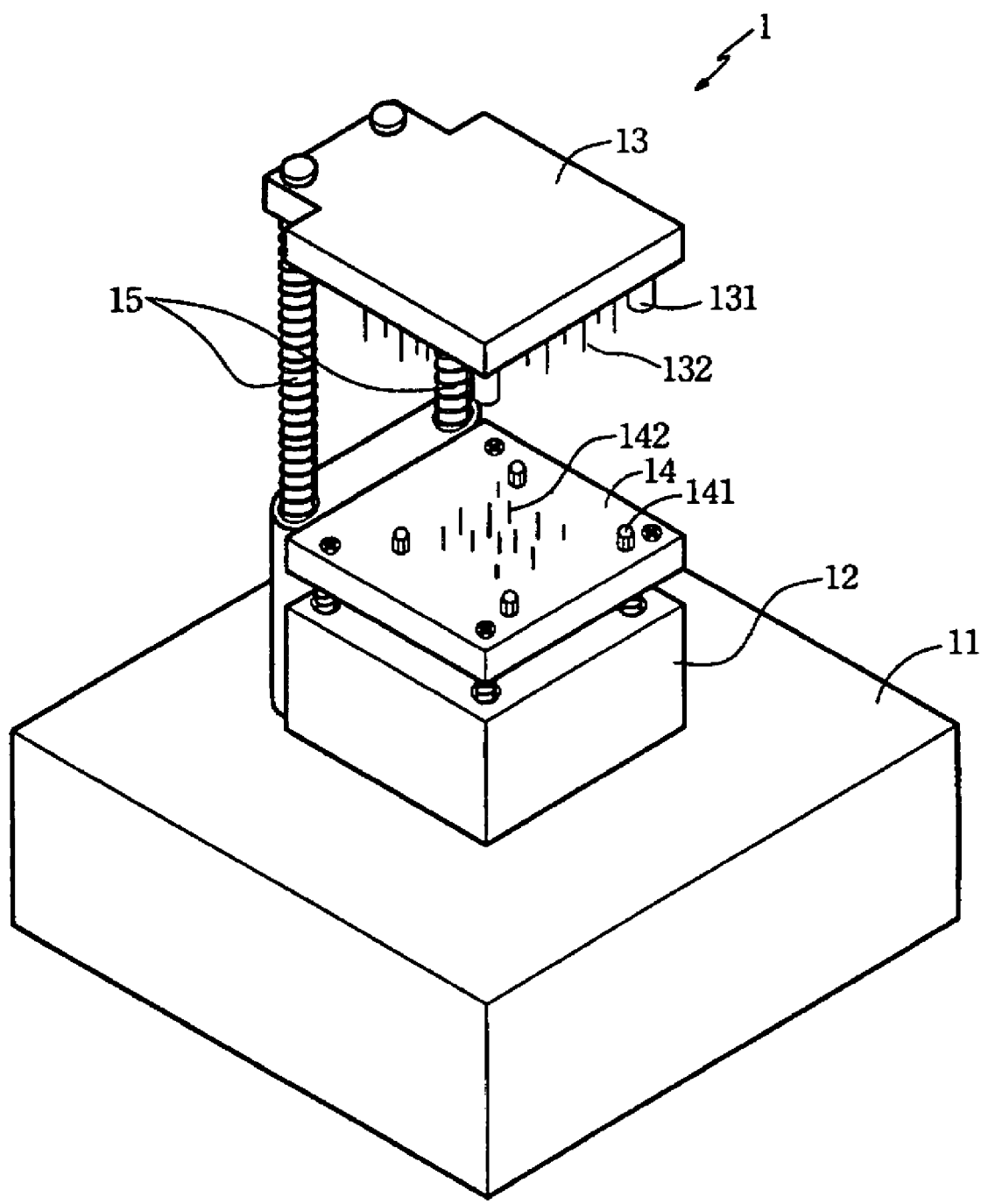
FIG. 1 is a perspective view of a conventional test apparatus in an open position.
Figure 2:
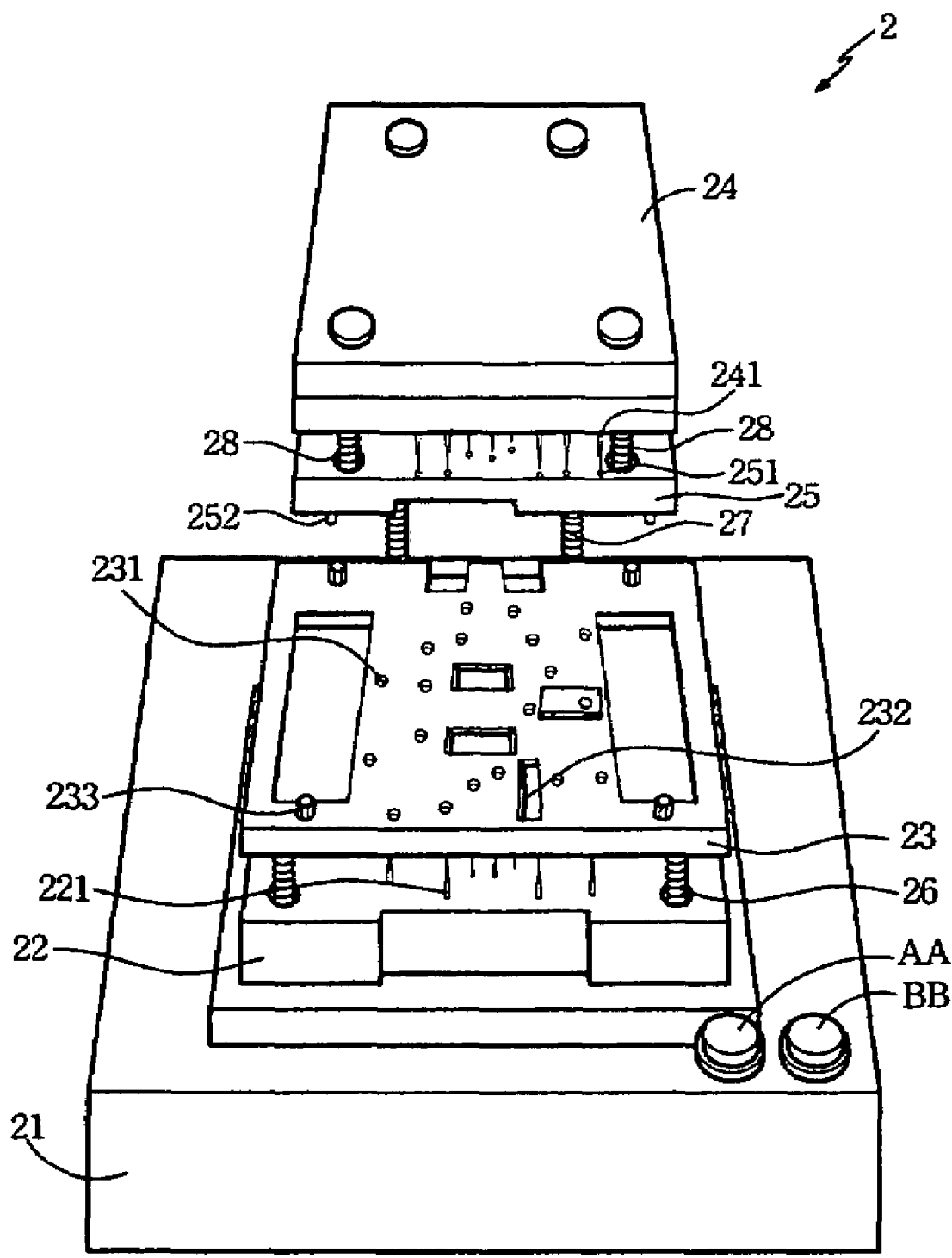
FIG. 2 is a perspective view of the first preferred embodiment of a test apparatus of the present invention in an open position.

Referring to FIG. 2, the first preferred embodiment of a test apparatus in accordance with the present invention is shown for testing operation of a printed circuit board (not visible), and includes a bottom seat 21, a lower plate 22, a lower spacer disc 23, an upper plate 24, an upper spacer disc 25 and a two-step driving mechanism. Note that the test operation of the printed circuit board is conducted in the two-step manner. In this embodiment, the two-step driving mechanism is not visible since the same is mounted within the bottom seat 21.

The lower plate 22 is coupled operably onto the bottom seat 21, and has an upper surface formed with a plurality of first probes 221 for engaging the electrical contacts mounted on one side of the printed circuit board under test. The lower spacer disc 23 is coupled operably to the lower plate 22, and has a plurality of first openings 231 respectively aligned with the first probes 221 of the lower plate 22. The upper plate 24 is disposed above the lower space lower disc 23, is coupled operably onto the bottom seat 21, and has a lower surface formed with a plurality of second probes 241. The upper spacer disc 25 is disposed below the upper plate 24, and has a plurality of second openings 251 respectively aligned with the second probes 241 of the upper plate 24.

The first preferred embodiment includes a first coupling unit 26 for mechanically coupling the lower spacer disc 23 to the lower plate 22, a second coupling unit 27 for mechanically coupling the upper plate 24 to the bottom seat 21 and a third coupling unit 28 for coupling mechanically the upper spacer disc 25 to the upper plate 24. Before positioning the printed circuit board on the lower spacer disc 23, a first predetermined gap is defined between the lower spacer disc 23 and the lower plate 22, and a second predetermined gap is defined between the upper spacer disc 25 and the upper plate 22. During the test operation, the lower plate 22 is moved toward the lower spacer disc 23 via the first coupling unit 26 such that the probes 221 of the lower plates 22 extend respectively through the opening 231 in the lower spacer disc 23 to engage the electrical contacts formed on one side surface of the printed circuit board. At the same time, the upper plate 24 is moved toward the upper spacer disc 25 via the third coupling unit 28 such that the probes 241 of the upper plates 24 extend respectively through the opening 251 in the upper spacer disc 25 to engage the electrical contacts formed on the other side surface of the printed circuit board.

The bottom seat 21 includes a plurality of circuit paths for establishing electrical communication with the probes of the upper and lower plates 22, 24 and for activating the first, second and third coupling units 26,27,28 in the two-step manner. The driving mechanism (not visible) moves the lower plate 22, the lower spacer disc 23, the upper plate 24 and the upper spacer disc 25 relative to one another in two-step manner via the coupling units 26,27,28. In the present invention, a pneumatically operated piston unit serves as the two-step driving mechanism. In addition, any other structure (such as electrically operated device) can be used for activating the first, second and third coupling units 26,27,28. Therefore, no limitation should be set for the structure of the two-step driving mechanism.

Therefore, once the printed circuit board under test is disposed on the lower space disc 23, activation of the driving mechanism in a first step results in relative movement between the lower and upper spacer discs 23,25, thereby sandwiching and retaining the printed circuit board between the lower and upper spacer discs 23, 25. In the same manner, activation of the driving mechanism in a second step results in relative movement between the lower and upper plates 22, 24 so as to sandwich the lower and upper spacer discs 23,25 between the lower and upper plates 22, 24 such that the probes 221, 241 of the lower and upper plates 22, 24 extend respectively through the openings 231, 251 in the lower and upper spacer discs 23, 25 to engage the electrical contacts on opposite side surfaces of the printed circuit board.

In the first preferred embodiment, the lower spacer disc 23 is formed with a plurality of recesses 232 or holes for reception of protrusions formed on the printed circuit board under test (not shown). In addition, the lower spacer disc 23 is formed with four upwardly projecting retention inserts 233. The upper spacer disc 25 is formed with a plurality of reception tubes 252 for receiving the inserts 233 respectively so as to enhance sandwiching of the printed circuit board between the upper and lower spacer discs 25, 23.

The first preferred embodiment further includes a control unit for activating the driving mechanism in the first and second steps, i.e. full automatic manner. Preferably, the control unit includes a relay for controlling the circuit paths and a switch buttons for switching on and off the relay. AA and BB are two switch buttons for activating the test apparatus of the present invention in the first and second steps.

Figure 3A:
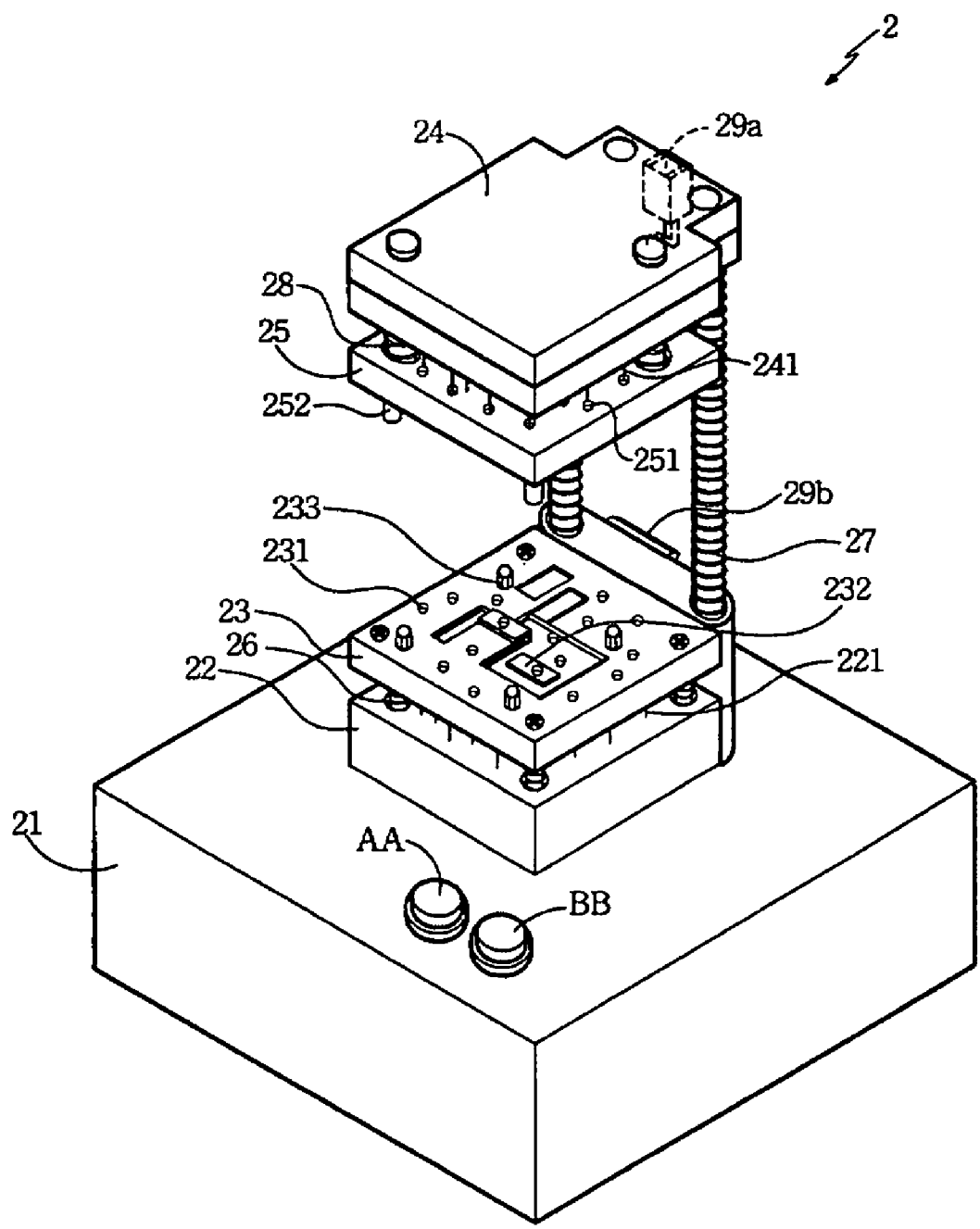
FIG. 3A is a perspective view of the second preferred embodiment of the test apparatus of the present invention in the open position.
Figure 3B:
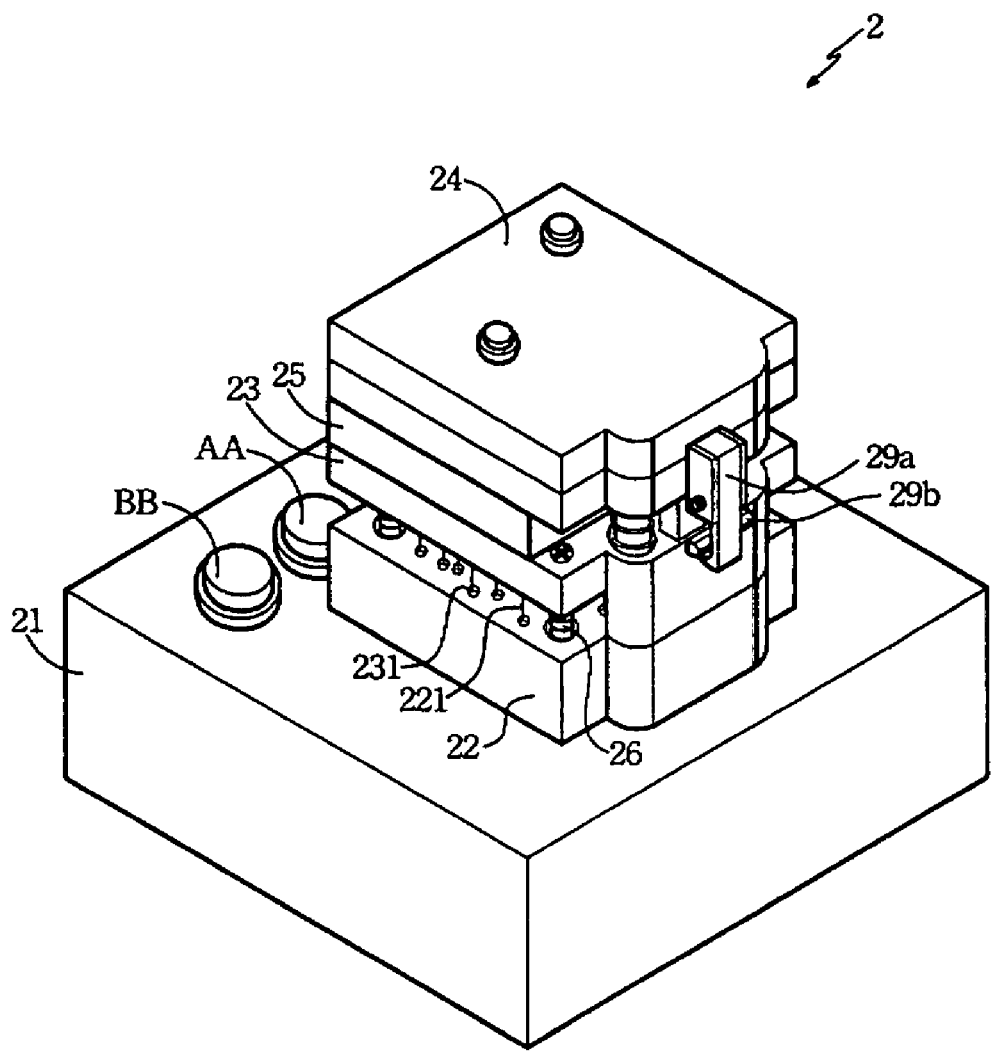
FIG. 3B is a perspective view of the second preferred embodiment of the test apparatus of the present invention in a closed position.

The test result of the printed circuit board is generally read or confirmed by means of other devices, such as a display (not shown) mounted on top of the bottom seat 21. FIGS. 3A and 3B respectively show perspective view of the second preferred embodiment of the test apparatus of the present invention in open and closed positions. The second preferred embodiment has the structure similar to the previous embodiment, except in that two units of hook member 29a, 29b or clamp member are utilized in order to enhance sandwiching and retention of the printed circuit board between the upper and lower spacer discs 25,23.

Damage done onto the probes formed on the upper and lower plate 24, 22 is avoided due to the first and second activation of the driving mechanism, because when the printed circuit board is sandwiched between the spacer discs 23, 25, the same is mobilized securely in such a manner that the electrical contacts of the printed circuit board are respectively aligned with the probes of the upper and lower plates 24, 22. If desired, the test apparatus of the present invention is operated manually or in semi-automatic manner.

Figure 4A:
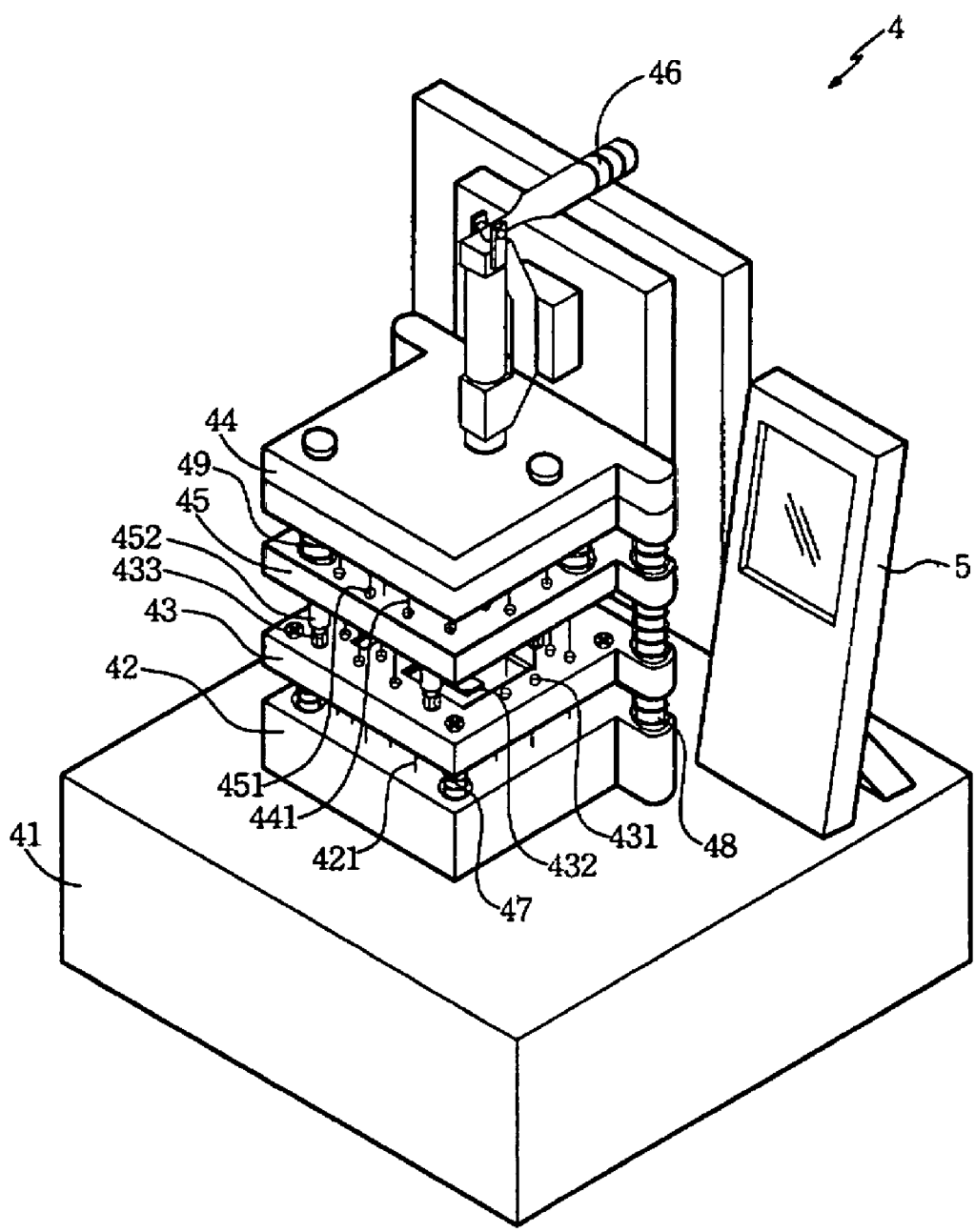
FIG. 4A is a perspective view of the third preferred embodiment of the test apparatus of the present invention in an open position.
Figure 4:
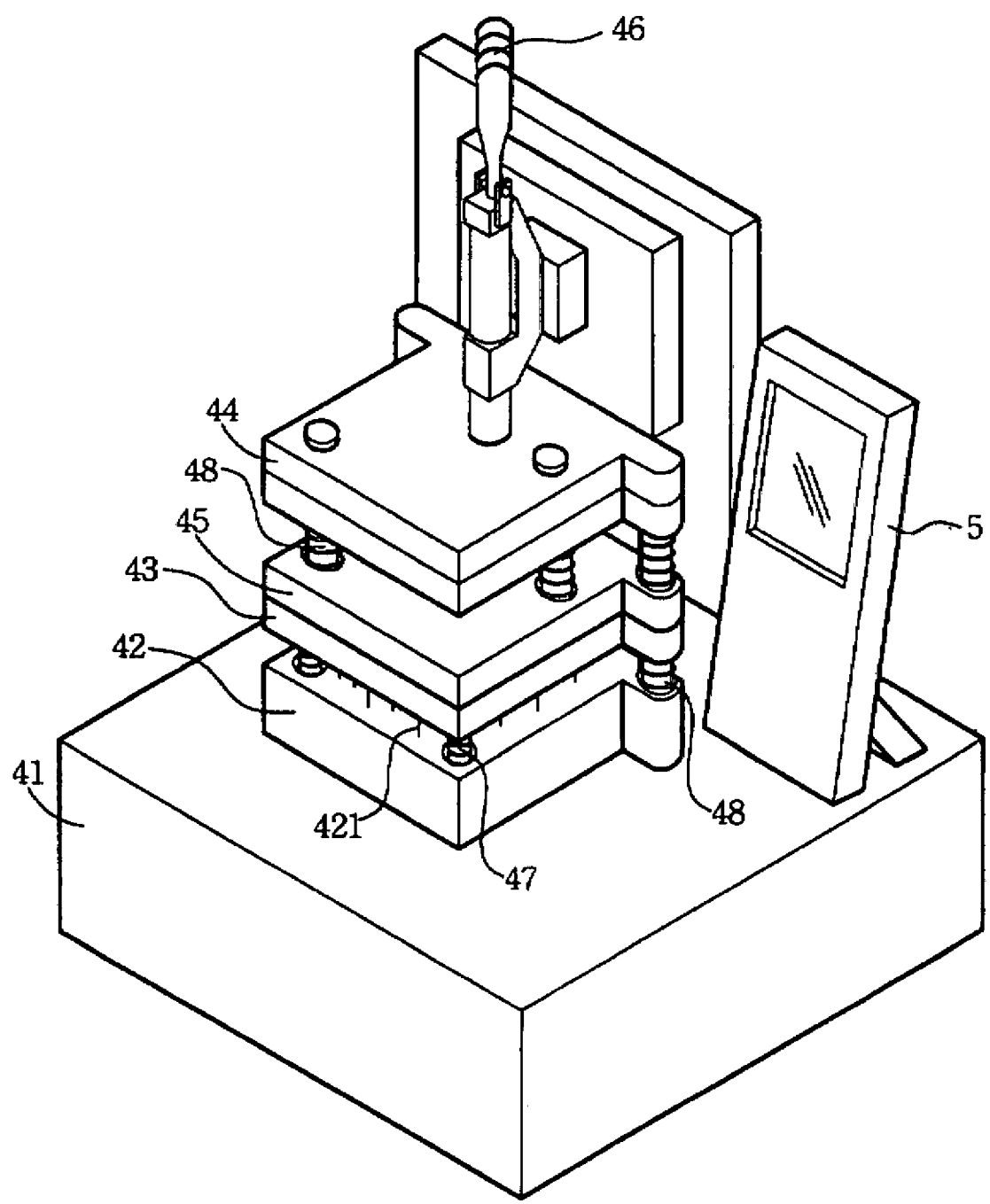
FIG. 4B is a perspective view, illustrating a first step position of the third preferred embodiment of the test apparatus of the present invention during the test operation.
FIG. 4C is a perspective view of the third preferred embodiment of the test apparatus of the present invention in a second step position.
Figure 4:
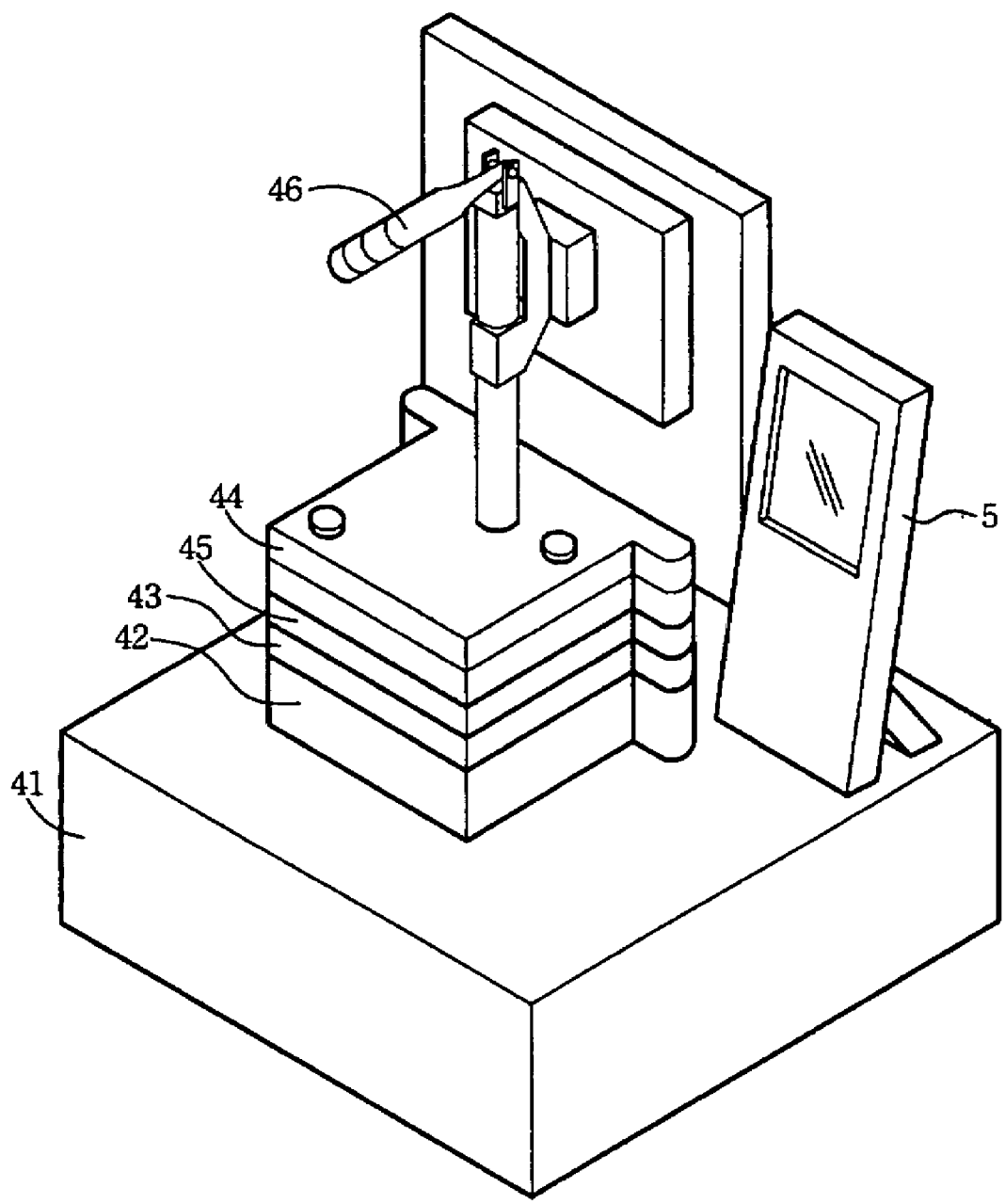

FIG. 4A is a perspective view of the third preferred embodiment of the test apparatus of the present invention in a open position. FIG. 4B is a perspective view, illustrating a first step position of the second preferred embodiment of the test apparatus during the test operation. FIG. 4C is a perspective view of the third preferred embodiment of the test apparatus of the present invention in a second step position. The third preferred embodiment 4 is operated manually in the two step manner, and includes a bottom seat 41, a lower plate 42, a lower spacer disc 43, an upper plate 44, an upper spacer disc 45 and a manually operated coupling shaft 46. The lower plate 42 is coupled operably onto the bottom seat 41, and has an upper surface formed with a plurality of first probes 421 for engaging the electrical contacts mounted on one side of the printed circuit board under test. The lower spacer disc 43 is coupled operably to the lower plate 42, and has a plurality of first openings 431 respectively aligned with the probes 421 of the lower plate 42. Before positioning the printed circuit board on the lower spacer disc 43, as best illustrated in FIG. 4A, a first predetermined gap is defined between the lower spacer disc 43 and the lower plate 42, and a second predetermined gap is defined between the upper spacer disc 45 and the upper plate 42. During the test operation, the lower plate 42 is moved toward the lower spacer disc 43 via the first coupling unit 47 such that the probes 421 of the lower plates 42 extend respectively through the opening 431 in the lower spacer disc 43 to engage the electrical contacts formed on one side surface of the printed circuit board. The upper plate 44 is disposed above the upper spacer disc 43, and is coupled to the bottom seat 41 via the second coupling unit 48. The upper plate 44 has a lower surface formed with a plurality of probes 441. The upper spacer disc 45 is disposed below the upper plate 44, and has a plurality of second openings 451 respectively aligned with the probes 441 of the upper plate 44 such that during the test operation, the upper plate 44 is moved toward the upper spacer disc 45 via the third coupling unit 49 such that the probes 441 of the upper plates 44 extend respectively through the opening 451 in the upper spacer disc 45 to engage the electrical contacts formed on the other side surface of the printed circuit board.

In the third preferred embodiment 4, the lower spacer disc 423 is formed with a plurality of recesses 432 for reception of protrusions formed on the printed circuit board under test (not shown). In addition, the lower spacer disc 43 is formed with four upwardly projecting retention inserts 433. The upper spacer disc 45 is formed with a plurality of reception tubes 452 for receiving the inserts 433 respectively so as to enhance sandwiching of the printed circuit board between the upper and lower spacer discs 45, 43.

The bottom seat 41 includes a plurality of circuit paths for establishing electrical communication with the probes of the upper and lower plates 42, 44 and for activating the first, second and third coupling units 47, 48, 49 in the two-step manner. The driving mechanism (not visible) moves the lower plate, the lower spacer disc, the upper plate and the upper spacer disc relative to one another in two-step manner via the control unit. Note that in the present invention, the coupling shaft 46 serves as the two-step driving mechanism and is coupled to the first, second and third coupling units 47, 48, 49 of a pneumatically operated piston unit. Under this condition, once the printed circuit board under test is disposed on the lower space disc 43, activation of the coupling shaft 46 in the first step via the second coupling unit 48 results in relative movement between the lower and upper spacer discs 43,45, thereby sandwiching and retaining the printed circuit board between the lower and upper spacer discs 43, 45. After securing the position of the printed circuit board between the lower and upper spacer discs 43, 45, activation of the coupling shaft 46 in the second step via the first and third coupling units 47, 49 results in relative movement between the lower and upper plates 42, 44 so as to sandwich the lower and upper spacer discs 43,45 between the lower and upper plates 42, 44 such that the probes of the lower and upper plates 42, 44 extend respectively through the openings in the lower and upper spacer discs 43, 45 to engage the electrical contacts on opposite side surfaces of the printed circuit board, thereby conducting the test operation. The test result of the printed circuit board is generally displayed in a display device 5, such as a monitor, mounted on top of the bottom seat 41.

Note that in the third preferred embodiment, the lower spacer disc has an upper surface greater than a lower surface of the upper spacer disc. Generally, the electrical contacts of the printed circuit board under test are concentrated at the middle portion thereof so as to reserve the outer peripheral portion for soldering with the other electronic components in case the circumstance demands in the future. The purpose of designing a smaller surface area in the upper spacer disc relative to the lower spacer disc is to avoid undesired pressing on the outer peripheral portion of the printed circuit board during the testing operation, thereby eliminating the defect of bending in the printed circuit board generally encountered when using the prior test apparatus.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A test apparatus of a printed circuit board, comprising:
   a bottom seat;
   a lower plate coupled operably onto said bottom seat, and having an upper surface formed with a plurality of first probes;
   a lower spacer disc coupled operably to said lower plate, and having a plurality of first openings respectively aligned with said first probes of said lower plate;
   an upper plate disposed above said lower space lower disc, coupled operably onto said bottom seat, and having a lower surface formed with a plurality of second probes;
   an upper spacer disc disposed below said upper plate, and having a plurality of second openings respectively aligned with said second probes of said upper plate; and
   a two-step driving mechanism for moving said lower plate, said lower spacer disc, said upper plate and said upper spacer disc relative to one another in two-step manner;
   wherein, once the printed circuit board under test is disposed on said lower space disc, activation of said driving mechanism in a first step results in relative movement between said lower and upper spacer discs, thereby sandwiching and retaining the printed circuit board between said lower and upper spacer discs, and activation of said driving mechanism in a second step results in relative movement between said lower and upper plates so as to sandwich said lower and upper spacer discs between said lower and upper plates such that said probes of said lower and upper plates extend respectively through said openings in said lower and upper spacer discs to engage two opposite side surfaces of the printed circuit board.

2. The test apparatus according to claim 1, wherein said two-step driving mechanism includes a pneumatically operated piston unit.

3. The test apparatus according to claim 1, further comprising a control unit for controlling said driving mechanism in said first and second steps.

4. The test apparatus according to claim 3, wherein said control unit includes a relay for controlling inner circuit paths and a switch button for switching on and off said relay.

5. The test apparatus according to claim 1, wherein said control unit includes a manually operated coupling shaft.

6. The test apparatus according to claim 1, wherein said two-step driving mechanism is mounted within said bottom seat.

7. The test apparatus according to claim 1, further comprising a first coupling unit for mechanically coupling said lower spacer disc to said lower plate, a second coupling unit for mechanically coupling said upper plate to said bottom seat and a third coupling unit for coupling mechanically said upper spacer disc to said upper plate, wherein activation of said driving mechanism in said first step via said second coupling unit results in sandwiching and retaining the printed circuit board between said upper and lower spacer discs, and activation of said driving mechanism in said second step via said first and third coupling units results in simultaneous movement of said upper and lower plates with respect to said bottom seat, which, in turn, causes sandwiching of said upper and lower spacer discs between said upper and lower plates.

8. The test apparatus according to claim 1, wherein said lower spacer disc is formed with a plurality of recesses for reception of protrusions formed on the printed circuit board.

9. The test apparatus according to claim 1, wherein said lower spacer disc is formed with a plurality of upwardly projecting retention inserts, said upper spacer disc being formed with a plurality of reception tubes for receiving said inserts respectively so as to enhance sandwiching of said lower and upper spacer discs.

10. The test apparatus according to claim 1, wherein said lower spacer disc has an upper surface greater than a lower surface of said upper spacer disc.

\* \* \* \* \*